United States Patent
Verhaegh et al.

(10) Patent No.: US 6,198,155 B1
(45) Date of Patent: Mar. 6, 2001

(54) SEMICONDUCTOR DEVICE COMPRISING AN INTEGRATED CIRCUIT PROVIDED WITH A CERAMIC SECURITY COATING AND METHOD OF MANUFACTURING SUCH A DEVICE

(75) Inventors: Nijnke A. M. Verhaegh; Joseph G. Van Lierop; Marcus J. Van Bommel, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/328,253

(22) Filed: Jun. 8, 1999

(30) Foreign Application Priority Data

Jun. 10, 1998 (EP) .................................................. 98201941

(51) Int. Cl.[7] .................................................. H01L 21/331

(52) U.S. Cl. .......................... 257/588; 257/565; 257/587; 257/734

(58) Field of Search ............................ 438/106; 257/565, 257/587, 588, 734

(56) References Cited

U.S. PATENT DOCUMENTS

| 4,243,427 | | 1/1981 | Dibugnara ............................. 106/287 |
|---|---|---|---|
| 4,849,296 | * | 7/1989 | Haluska et al. . |
| 5,203,915 | | 4/1993 | Alim ..................................... 106/286 |
| 5,221,558 | * | 6/1993 | Sonuparlak et al. . |
| 5,399,441 | | 3/1995 | Bearinger et al. .................... 428/689 |
| 5,591,680 | | 1/1997 | Tuttle et al. .......................... 437/238 |
| 5,744,244 | | 4/1998 | Camiletti et al. ..................... 428/447 |

\* cited by examiner

Primary Examiner—Kevin M. Picardat
Assistant Examiner—D. M. Collins
(74) Attorney, Agent, or Firm—Steven R. Biren

(57) ABSTRACT

A semiconductor device comprising a silicon substrate is provided with semiconductor elements on a first side, a metallization with connection pads for external contact, and a passivation layer which leaves the connection pads of the metallization exposed. The integrated circuit thus formed is also provided with a ceramic security coating having a matrix of monoaluminium phosphate which also leaves the connection pads of the metallization exposed. The protective layer can be deposited so as to have a thickness in the range from 2 to 10 $\mu$m, and hence is suitable for protecting integrated circuits used in smart cards. As a result, the information stored therein is not accessible.

3 Claims, 3 Drawing Sheets

SEMICONDUCTOR DEVICE COMPRISING AN INTEGRATED CIRCUIT PROVIDED WITH A CERAMIC SECURITY COATING AND METHOD OF MANUFACTURING SUCH A DEVICE

Semiconductor device comprising an integrated circuit provided with a ceramic security coating and method of manufacturing such a device.

The invention relates to a semiconductor device having a silicon substrate which is provided on a first side with semiconductor elements, a metallization with connection pads for external contact and a passivation layer which leaves the connection pads of the metallization exposed, said first side further being provided with a ceramic security coating which also leaves the connection pads of the metallization exposed. The invention also relates to a method of manufacturing such a semiconductor device.

The semiconductor elements and the metallization form an integrated circuit which can be externally contacted by means of the connection pads. The circuit is covered with a passivation layer which, in practice, is a layer of silicon oxide or silicon nitride.

The ceramic security coating serves to render the integrated circuit inaccessible. By virtue thereof, reverse engineering is precluded. It is also precluded that restricted information stored in the integrated circuit is easily accessible. The latter is important if the integrated circuit is used in "smart cards", such as cash cards and credit cards. The protective layer should offer optical, physical and chemical protection. The layer must absorb, scatter or reflect radiation, visible light as well as UV, IR and electron radiation. The layer must be resistant to scratching and polishing. In addition, it must be impossible to remove the layer by etching without rendering the underlying circuit useless.

In U.S. Pat. No. 5,399,441 a description is given of a semiconductor device of the type mentioned in the opening paragraph, in which the ceramic security coating is a layer having a matrix of silicon oxide. This matrix is formed by heating a layer of a solution of a silicon-oxide monomer, such as hydrogen silsesqui oxane, in for example toluene. The monomer may also include organic side groups. The silicon oxide matrix is formed by heating at a temperature in the range between 50° C. and 800° C. In this manner, a porous ceramic layer is formed. To give the layer desired properties, particles of a filler may be incorporated in the matrix of silicon oxide. In this manner it is possible, for example, to render the layer opaque and provide the layer with a rough surface.

If the layer is used on an integrated circuit having a passivation layer of silicon nitride, then the protective layer must be very thick. The protective layer is porous, so that etch solutions can penetrate through the layer. The silicon oxide-containing protective layer may be etched away in etch baths, such as HF-containing baths, without seriously attacking the underlying silicon nitride layer. The selectivity with which silicon oxide can be etched in relation to silicon nitride is very high. Care must be taken that, before the protective layer is entirely etched away, the underlying silicon nitride layer has been removed and sufficient damage has been done to the underlying circuit. The protective layer having a matrix of silicon oxide must be provided in a thickness which is at least one hundred times the thickness of the passivation layer of silicon nitride. In practice, the passivation layer has a thickness of approximately 2 $\mu$m, so that the protective layer must have a thickness of at least 200 $\mu$m. If the integrated circuit is to be used in "smart cards", said thickness of the protective layer is undesirable. In the case of integrated circuits for "smart cards", the silicon substrate including semiconductor elements, metallization and passivation layers has a thickness of approximately 150 $\mu$m. The integrated circuit is incorporated in a plastic card having a thickness of approximately 500 $\mu$m. Preferably, the thickness of the security layer does not exceed 10 $\mu$m.

It is an object of the invention to provide a semiconductor device of the type mentioned in the opening paragraph, which semiconductor device has a relatively thin protective layer, so that it is more suitable for use in smart cards. To achieve this, this semiconductor device is characterized in that the ceramic security coating is a layer having a matrix of monoaluminium phosphate. Such a layer has a very great mechanical strength and is not attacked in customary etch baths. The layer can be readily provided in a thickness ranging from 2 to 10 $\mu$m. As a result, the thickness of the integrated circuit is increased only to a very small degree by the provision of this protective layer, so that the circuit can suitably be used in smart cards. The layer can be applied to customary passivation layers. In customary etch baths, the passivation layers, which are situated below the porous protective layer, are often attacked while the protective layer remains intact. Since the protective layer only has a small thickness, the provision of said layer causes only very small stresses in the silicon substrate, which do not adversely affect the operation of the integrated circuit.

To render the protective layer impervious to radiation as well, particles may be added to the layer which absorb or scatter said radiation. These particles may consist, for example, of aluminium oxide, zirconium oxide, silicon oxide, titanium oxide, zinc oxide, silicon carbide or titanium carbide. Preferably, titanium dioxide particles are incorporated in the matrix of monoaluminium phosphate. The particles added to the layer have a diameter of approximately 0.25 $\mu$m, and they render this layer impervious to radiation if only 65% by weight of these particles is added to the layer.

In a further embodiment of the semiconductor device in accordance with the invention, a top layer having a matrix of monoaluminium phosphate in which no particles are incorporated is provided on the ceramic layer having a matrix of monoaluminium phosphate in which titanium oxide particles are incorporated. Due to the addition of these particles, the layer with the titanium dioxide particles has a relatively rough surface. By providing the above-mentioned top layer on this surface, a flat is obtained. The layer containing titanium dioxide particles is planarized by the top layer. In addition, when the top layer is provided, it penetrates into the pores of the titanium dioxide-containing layer, thereby forming a dense, strong layer. The resultant denser layer also makes better contact with the passivation layer, so that the adhesion to the passivation layer is better too.

In the manufacture of the semiconductor device mentioned in the opening paragraph, the ceramic security coating is formed, in accordance with the invention, on the first side of the silicon substrate by depositing a layer of a solution of monoaluminium phosphate in water on this side and subsequently heating this layer to a temperature in the range from 250° C. to 450° C. During the thermal treatment, the monoaluminium phosphate matrix is formed. Titanium oxide particles may be added to the solution in the form of a powder and are incorporated in the matrix during the thermal treatment. The layer is formed in an environmentally friendly manner because in the formation of the layer, water is used as the solvent. As mentioned hereinabove, toluene is used as the solvent in the method known from U.S. Pat. No. 5,399,441.

Preferably, if the passivation layer is a layer of silicon nitride, said passivation layer is superficially oxidized in an ozone-containing atmosphere, prior to the deposition of the monoaluminium phosphate solution. By virtue thereof, the adhesion of the ceramic layer is improved. The monoaluminium phosphate matrix is chemically bonded to the surface of the passivation layer.

A further advantage of the method resides in that the layer with the monoaluminium phosphate solution can be readily selectively deposited on the first side of the silicon substrate by providing the layer with a hydrophobic surface at locations where said layer is not desired. The aqueous solution in which the monoaluminium phosphate layer is provided adheres to hydrophilic surfaces, such as the customary passivation layers, but not to hydrophobic surfaces.

The hydrophobic surfaces can be readily formed by providing the first side with a layer of a photoresist at the desired locations. In this manner, the connection pads can be provided with a hydrophobic layer. On a slice of silicon, many integrated circuits are made in practice, which are separated from each other by lanes where lines are scratched, the so-called scribe lines, whereafter the slice is broken into pieces comprising a single circuit. Also the scribe lines may be covered with a layer of a photoresist, so that the ceramic security coating is not provided on said scribe lines. As a result, the separation of the integrated circuits is not hampered by the hard ceramic layer. After deposition of the aqueous solution, the photoresist can be removed, and the ceramic layer formed by heating.

If the solution of monoaluminium phosphate is customarily provided, for example by spinning or spraying, the surface is homogeneously covered. Upon heating, however, a non-homogeneous ceramic layer is often formed due to clustering of particles. This may be advantageous for the protective layer because an attempt to etch away the security layer will result in the underlying passivation layer being very inhomogeneously etched too. A more homogeneous layer can be obtained if approximately 10% by weight tetraethoxy silane is added to the solution of monoaluminium phosphate.

These and other aspects of the invention will be apparent from and elucidated with reference to the embodiments described hereinafter, which constitute a non-limitative example.

Figure 1:
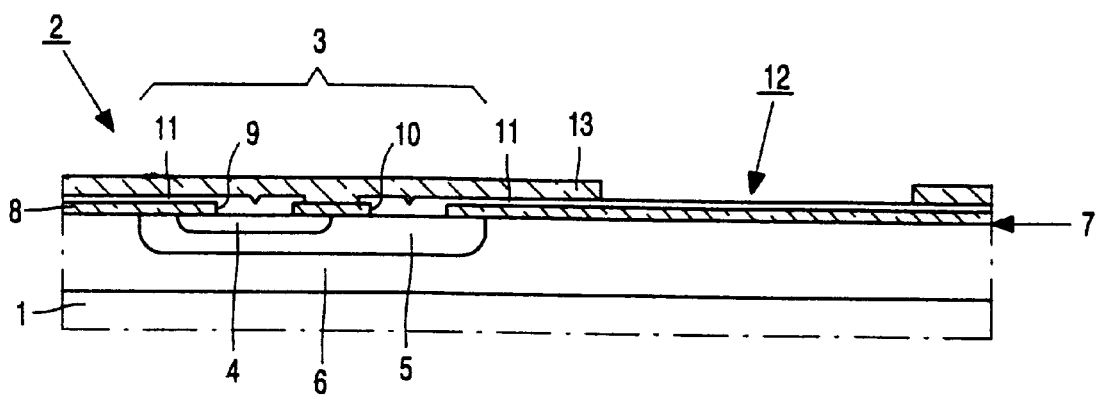
FIGS. 1 through 3 are diagrammatic, cross-sectional views of several stages in the manufacture of a semiconductor device in accordance with the invention.
Figure 2:
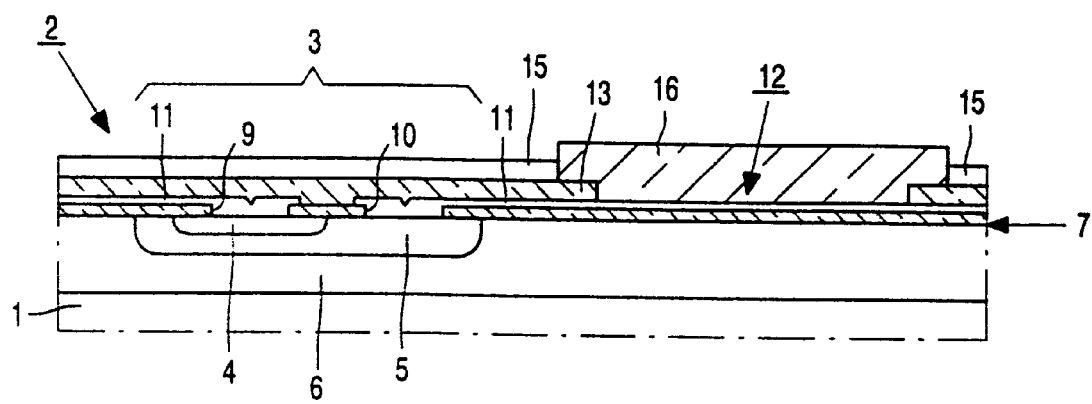
Figure 3:
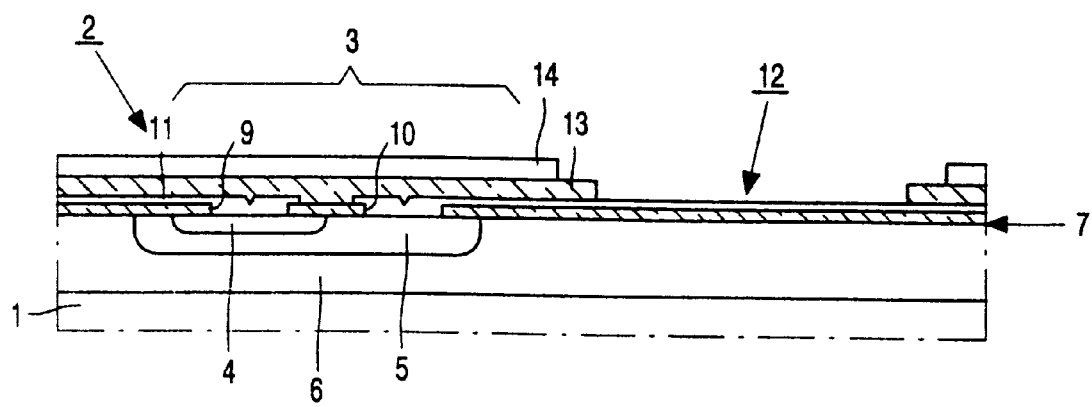

FIGS. 1 through 3 are diagrammatic, cross-sectional views of several stages in the manufacture of a semiconductor device comprising a silicon substrate 1 which is provided on a first side 2 with semiconductor elements 3, in this example a bipolar transistor with an emitter region 4, a base region 5 and a collector region 6. The surface 7 of the silicon substrate is provided with an insulating layer 8 of silicon oxide having contact windows 9 and 10. A metallization 11, formed in an aluminium layer contacts in the windows 9 and 10, the emitter region 4 and the base region 5. The metallization is provided with a connection pad 12 for external contact. A passivation layer 13 which leaves the connection pads 12 of the metallization 11 exposed is situated on the first side 2. In practice, this passivation layer 13 is a layer of silicon oxide or silicon nitride. For the sake of simplicity, only one semiconductor element is shown, but in practice the silicon substrate comprises a plurality of these elements, and the metallization consists of a number of layers and, in addition, is provided with many connection pads for external contact. The assembly forms an integrated circuit.

The first side is further provided with a ceramic security coating 14 which also leaves the connection pads 12 of the metallization 1 1 exposed. The ceramic security coating 14 serves to render the integrated circuit inaccessible. As a result, reverse engineering is precluded. It is also precluded that restricted information stored in the integrated circuit is readily accessible, which is important if the integrated circuit is used in "smart cards", such as cash cards and credit cards.

The ceramic security coating 14 is a layer with a matrix of monoaluminium phosphate. This layer is mechanically strong and is not attacked in customary etch baths. The layer can be easily applied in a thickness ranging from 2 to 10 $\mu$m. In the case of integrated circuits for "smart cards", the silicon substrate including the semiconductor elements, the metallization and the passivation layer has an overall thickness of approximately 150 $\mu$m. The integrated circuit is incorporated in a plastic card having a thickness of approximately 500 $\mu$m. Consequently, the thickness of the integrated circuit is increased only to a very small degree by the provision of this protective layer, which renders the circuit suitable for use in smart cards. The layer can be applied to customary passivation layers of silicon oxide and silicon nitride. In customary etch baths, the passivation layers, which are situated below the porous protective layer 14, are often attacked, whereas the protective layer 14 remains intact. Since the protective layer only has a small thickness, the provision of this layer induces only very small stresses in the silicon substrate, which do not adversely affect the operation of the integrated circuit.

To render the protective layer 14 impervious to radiation as well, particles which absorb or scatter said radiation may be added to the layer. These particles may be, for example, particles of aluminium oxide, zirconium oxide, silicon oxide, titanium oxide, zinc oxide, silicon carbide or titanium carbide. Preferably, titanium dioxide particles are incorporated in the matrix of monoaluminium phosphate. Titanium dioxide particles with a diameter of approximately 0.25 $\mu$m can be added to the layer and cause this layer, having the above-mentioned small thickness of 2 to 10 $\mu$m, to be impervious to radiation if only 65% by weight of these particles is added to the layer.

In a further embodiment of the semiconductor device (not shown), the ceramic layer 14, which includes titanium oxide particles in the matrix of monoaluminium phosphate, is provided with a layer (not shown) with a matrix of monoaluminium phosphate in which no particles are incorporated. The layer with titanium dioxide particles has a relatively rough surface owing to the addition of these particles. By applying the above-mentioned top layer to this rough surface, a flat surface is obtained. The layer containing titanium dioxide particles is planarized by the top layer. In addition, during providing the top layer, said top layer penetrates into the pores of the layer containing titanium dioxide, so that a dense, strong layer is obtained. The resultant denser layer also makes better contact with the passivation layer, resulting in an improved adhesion to the passivation layer 13.

The ceramic protective layer 14 is formed on the first side 2 of the silicon substrate 1 by depositing a layer 15 of a solution of monoaluminium phosphate in water on this side and, subsequently, heating this layer to a temperature in the range from 250° C. to 450° C. During the thermal treatment, the layer 14 with the monoaluminium phosphate matrix is formed. Titanium oxide particles in powdered form may be added to the solution and are incorporated in the matrix during the thermal treatment. The layer is formed in an environmentally friendly manner since water is used as the solvent in the process leading to the formation of the layer.

If the passivation layer is a silicon nitride layer, preferably, the passivation layer 13 is superficially oxidized in an ozone-containing atmosphere before the solution of monoaluminium phosphate is deposited. This results in an improved adhesion of the ceramic layer. The monoaluminium phosphate matrix is chemically bonded to the surface of the passivation layer.

The layer 15 with the solution of monoaluminium phosphate can be readily selectively deposited on the first side 2 of the silicon substrate 1 by providing a hydrophobic surface at the locations where the layer is not desired. The aqueous solution in which the monoaluminium phosphate layer is provided adheres to hydrophilic surfaces, such as the customary passivation layers, but not to hydrophobic surfaces.

The hydrophobic surfaces can be easily formed by providing the first side 2 with a layer of a photoresist 16 at the desired locations. In this manner, the connection pads 12 are provided with a hydrophobic layer of a photoresist 16. In practice, many integrated circuits are made on a slice of silicon. Aligning characteristics present on the slice may be provided with a layer of a photoresist. The integrated circuits are separated from each other on the slice by lanes where lines are scratched, commonly referred to as scribe lines, whereafter the slice is broken into pieces including a single circuit. Also the scribe lines may be covered with a layer of a photoresist, so that the ceramic security coating is not provided on the scribe lines. In this case, separating the integrated circuits is not hampered by the hard ceramic layer. After deposition of the aqueous solution, the photoresist can be removed, and the ceramic layer can be formed by heating.

If the solution of monoaluminium phosphate is provided in the customary manner, for example by means of spinning or spraying, the first side 2 of the substrate 1 is homogeneously covered. Heating, however, will often cause a non-homogeneous ceramic layer to be formed as a result of clustering of particles. This may be advantageous to the protective layer 14 since an attempt to etch away the security layer will result in the underlying passivation layer 13 being inhomogeneously etched too. A more homogeneous deposition can be achieved if approximately 10% by weight tetraethoxy silane is added to the solution of monoaluminium phosphate.

EXAMPLE 1

Figure 4:
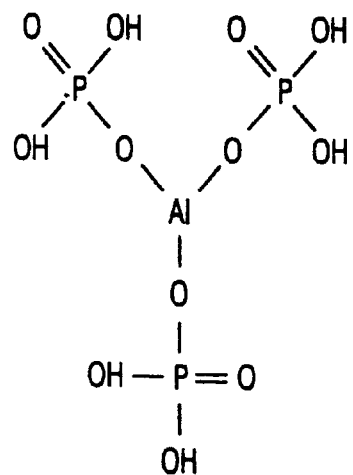
FIG. 4 shows the chemical structure of monoaluminium phosphate.

A quantity of 95 g 1N HCl is added to 100 g monoaluminium phosphate dissolved in water (50% by weight monoaluminium phosphate). This sol-gel mixture is subsequently stirred for approximately 20 minutes. The chemical structure of the monoaluminium phosphate molecule is shown in FIG. 4.

After a semiconductor substrate to which a passivation layer of silicon nitride is applied has been cleaned and locally provided with a layer of a photoresist, said solution is provided by spin-coating.

Figure 5:
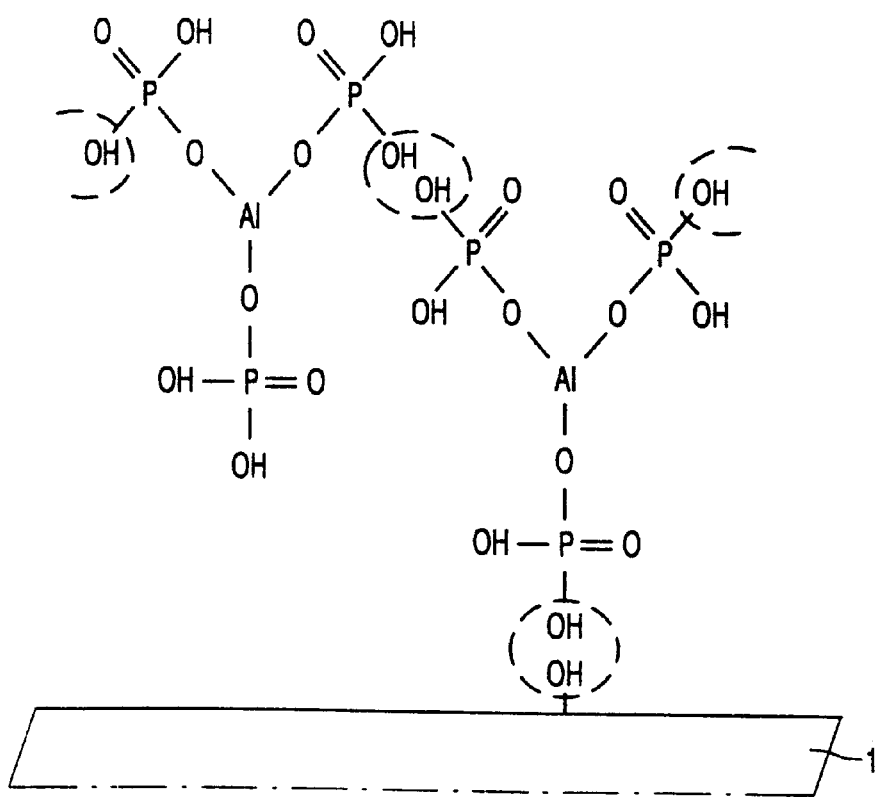
FIG. 5 shows the chemical structure of the layer of the solution of monoaluminium phosphate, as deposited on the first side of the silicon substrate.

Subsequently, the semiconductor substrate is dried at 100° C. for 30 minutes. FIG. 5 shows the chemical structure of the resultant spin-coated and dried layer.

Subsequently, the photoresist is removed by means of acetone. Finally, the monoaluminium phosphate matrix is formed by heating the semiconductor substrate at 400° C. for 30 minutes. In FIG. 5, the OH groups encircled by a broken line react, in which reaction water is liberated and an oxygen bond is formed between the monoaluminium phosphate molecules themselves and between the monoaluminium phosphate molecules and the surface of the substrate 1. In this manner, a matrix of monoaluminium phosphate is formed which is chemically bonded to the surface of the substrate.

EXAMPLE 2

A quantity of 70 g $TiO_2$ powder is added to the monoaluminium phosphate solution of the first example, the size of the powder particles being approximately 0.25 $\mu$m.

Figure 6:
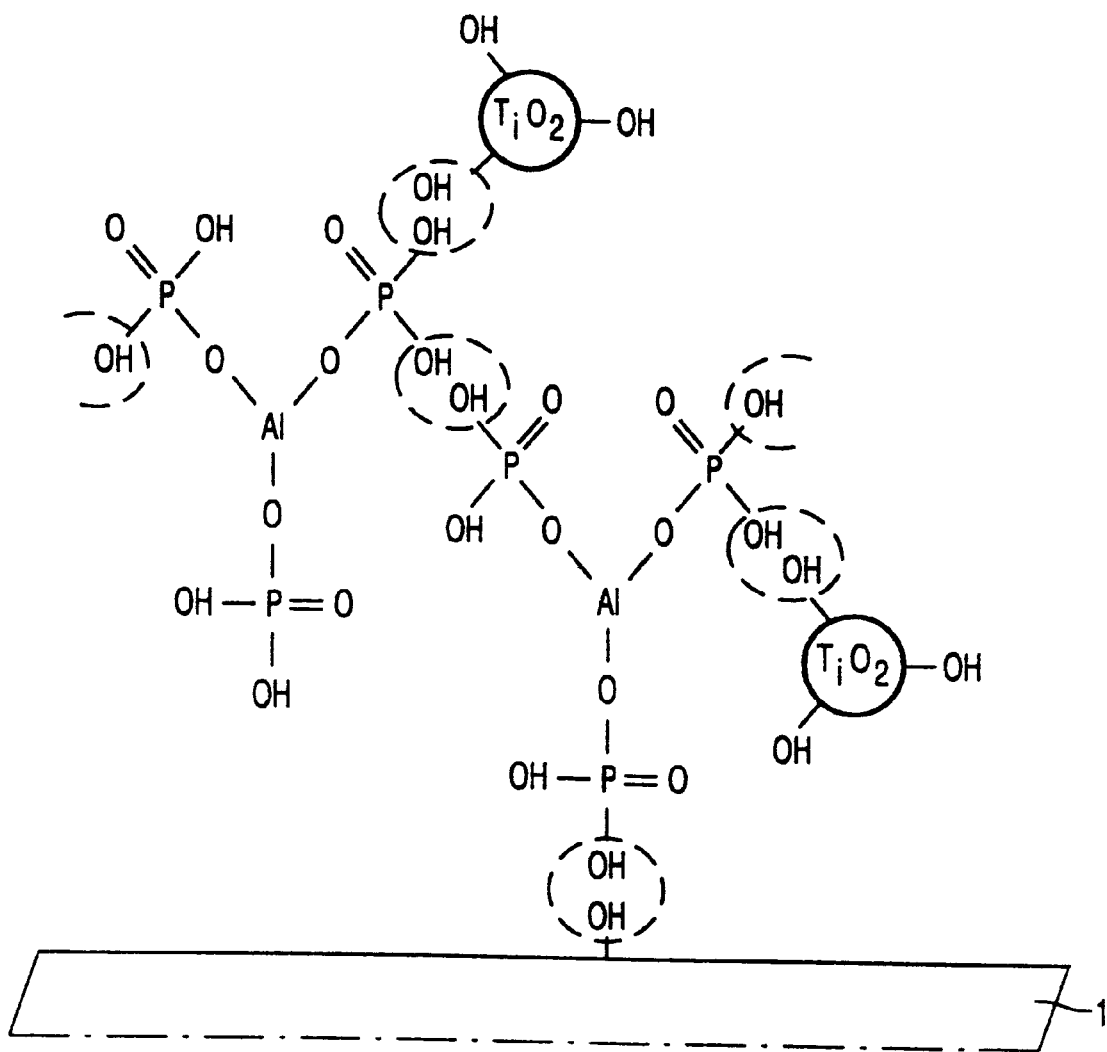
FIG. 6 shows the chemical structure of the layer shown in FIG. 5, in which titanium dioxide particles are incorporated.

A layer of this solution is applied to a substrate prepared in the same manner as in the first example. After drying at 100° C., the layer exhibits a chemical structure as shown in FIG. 6. The $TiO_2$ particles are incorporated between OH groups of the monoaluminium phosphate solution.

After drying, the photoresist is removed and a heating operation at 400° C. is performed. Also in this case, a matrix of monoaluminium phosphate is formed which is chemically bonded to the surface of the substrate 1 and in which the $TiO_2$ particles are also chemically bonded.

EXAMPLE 3

In this example, a layer of the solution described in example 2 is formed on a substrate which is prepared as described in example 1. After drying this layer at 100° C., a layer as described in example 1 is applied. After a subsequent drying process at 100° C., and after removing the photoresist, the heating operation is performed at 400° C. In this manner, a matrix of monoaluminium phosphate including $TiO_2$ particles is formed which is provided with a top layer without $TiO_2$ particles.

EXAMPLE 4

A quantity of 10 g tetraethoxy silane dissolved in 10 g ethanol is added to the monoaluminium phosphate solution described in the first example. The further treatment is the same as in said first example. After the thermal treatment at 400° C., the layer obtained is smoother than in the first example. The layer formed in the first example is granulated, while the layer formed in this example exhibits a flat surface.

What is claimed is:
1. A semiconductor device having a silicon substrate which is provided on a first side with semiconductor elements, a metallization with connection pads to provide for external contact and a passivation layer which leaves the connection pads of the metallization exposed, said first side further being provided with a ceramic security coating which coats the semiconductor elements and leaves the connection pads of the metallization exposed, wherein the ceramic security coating is a layer having a matrix of monoaluminium phosphate.

2. A semiconductor device as claimed in claim 1, characterized in that titanium dioxide particles are incorporated in the matrix of monoaluminium phosphate.

3. A semiconductor device as claimed in claim 2, characterized in that a top layer having a matrix of monoaluminium phosphate in which no particles are incorporated is provided on the ceramic layer having a matrix of monoaluminium phosphate in which titanium oxide particles are incorporated.

* * * * *